United States Patent
Klein et al.

(10) Patent No.: US 9,012,245 B1
(45) Date of Patent: Apr. 21, 2015

(54) METHODS OF MAKING INTEGRATED CIRCUIT PRODUCTS

(71) Applicant: Xilinx, Inc., San Jose, CA (US)

(72) Inventors: Matthew H. Klein, Redwood City, CA (US); Robert W. Wells, Cupertino, CA (US); Jongheon Jeong, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/493,078

(22) Filed: Sep. 22, 2014

(51) Int. Cl.
  *H01L 21/44* (2006.01)
  *H01L 21/66* (2006.01)
(52) U.S. Cl.
  CPC ............... *H01L 22/20* (2013.01); *H01L 22/14* (2013.01); *H01L 22/22* (2013.01)
(58) Field of Classification Search
  CPC H01L 22/22; H01L 22/20; G01R 31/318519; G01R 31/318516; G06F 17/5054; G06F 17/5068
  USPC ............. 438/14, 15, 106, 107; 716/117, 106, 716/112
  See application file for complete search history.

(56) References Cited

U.S. PATENT DOCUMENTS

| | | | |
|---|---|---|---|
| 6,664,808 B2 * | 12/2003 | Ling et al. | 326/41 |
| 6,762,965 B2 * | 7/2004 | Benedix et al. | 365/201 |
| 6,817,006 B1 | 11/2004 | Wells et al. | |
| 6,891,395 B2 | 5/2005 | Wells et al. | |
| 7,007,250 B1 | 2/2006 | Bapat et al. | |
| 7,127,697 B1 * | 10/2006 | Wells et al. | 716/106 |
| 7,143,295 B1 | 11/2006 | Trimberger | |
| 7,219,314 B1 | 5/2007 | Trimberger et al. | |
| 7,228,521 B1 * | 6/2007 | Ma et al. | 714/25 |
| 7,310,758 B1 | 12/2007 | Cossoul et al. | |
| 7,345,507 B1 | 3/2008 | Young et al. | |
| 7,402,443 B1 | 7/2008 | Pang et al. | |
| 7,451,421 B1 | 11/2008 | Bauer et al. | |
| 7,491,576 B1 | 2/2009 | Young et al. | |
| 7,498,192 B1 | 3/2009 | Goetting et al. | |
| 7,619,438 B1 * | 11/2009 | Trimberger | 326/10 |
| 7,793,251 B2 * | 9/2010 | Goodnow et al. | 716/117 |
| 8,001,511 B1 | 8/2011 | Bauer et al. | |

\* cited by examiner

*Primary Examiner* — Michael Trinh
(74) *Attorney, Agent, or Firm* — LeRoy D. Maunu

(57) ABSTRACT

In the disclosed methods, integrated circuit (IC) dice are manufactured from a common specification, and the IC dice are tested for defective circuitry. Respective defect sets are generated to indicate defective circuitry in the IC die. The dice are assigned to bins based on the respective defect sets. For each bin, all IC dice assigned to the bin have equivalent respective defect sets. Product definitions are provided, and each product definition indicates a respective set of circuitry required for a corresponding product. Respective sets of packages are manufactured for each product. In the manufacturing of each package of a respective set of packages for each product, one or more IC dice are selected from a subset of the plurality of bins such that the IC dice have respective defect sets allowed by the product definition of the product. The selected IC dice are then manufactured into the package.

20 Claims, 7 Drawing Sheets

METHODS OF MAKING INTEGRATED CIRCUIT PRODUCTS

TECHNICAL FIELD

The disclosure generally relates to making different integrated circuit products from integrated circuit dice having different sets of defective circuit elements.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

PLD providers typically provide "families" of PLDs, which are groups of related PLD products of different sizes. For example, a family of PLDs might all use the same basic tile, but include different numbers of the tiles, so they have different logic capacities. Therefore, a PLD user does not need to pay for a PLD with a much larger capacity than is actually required to implement a particular design. A typical method of generating a family of PLDs is to first manufacture the family member having the greatest anticipated customer demand. Once the first family member has been debugged and characterized and is deemed to meet the product specifications, other family members are manufactured, with each new family member being different from other family members. In order to avoid having to make costly new mask sets for new family members, the same chips have been used for products of different family members. For a product with the greatest capabilities, access to all the circuitry on the chip may be provided for implementing circuit designs. For products provided with lesser capabilities, access to selected circuitry on the chip may be limited.

SUMMARY

According to one method, a plurality of integrated circuit (IC) dice are manufactured from a common specification. The plurality of IC dice are tested for defective circuitry, and a respective defect set is generated for each IC die. Each defect set indicates defective circuitry in the IC die. The dice are assigned to bins based on the respective defect sets. For each bin, all IC dice assigned to the bin have equivalent respective defect sets. A plurality of product definitions are provided, and each product definition indicates a respective set of circuitry required for a corresponding product of a plurality of products. Respective sets of packages are manufactured for each product of the plurality of products. The manufacturing of each package includes selecting one or more IC dice from a subset of the plurality of bins, such that the one or more IC dice have respective defect sets allowed by the product definition of the product, and manufacturing the one or more IC dice into the package.

According to another method, a plurality of integrated circuit (IC) dice are manufactured from a common specification. The plurality of IC dice are tested for defective circuitry, and a respective defect set is generated for each IC die. Each defect set indicates defective circuitry in the IC die. The dice are assigned to bins based on the respective defect sets. For each bin, all IC dice assigned to the bin have equivalent respective defect sets. A plurality of product definitions are provided, and each product definition indicates a respective set of circuitry required for a corresponding product of a plurality of products. One of the product definitions specifies slot options for one of the plurality of products. The slot options indicate, for each IC-die position of a plurality of IC-die positions on a package of the one product, alternative defect sets that are permissible for each of the IC-die positions. Respective sets of packages are manufactured for each product of the plurality of products. The manufacturing of each package includes selecting one or more IC dice from a subset of the plurality of bins, such that the one or more IC dice have respective defect sets allowed by the product definition of the product. The selecting includes selecting, for each IC-die position on the package of the one product, an IC die from one of a first bin or a second bin of the plurality of bins. IC dice in the first bin have respective defect sets equivalent to one of the alternative defect sets, and IC dice in the second bin have respective defect sets equivalent to another one of the alternative defect sets. The one or more selected IC dice are manufactured into the package.

Other features will be recognized from consideration of the Detailed Description and Claims, which follow.

BRIEF DESCRIPTION OF THE DRAWINGS

Various aspects and features of the disclosed method will become apparent upon review of the following detailed description and upon reference to the drawings, in which.

DETAILED DESCRIPTION

Figure 1:
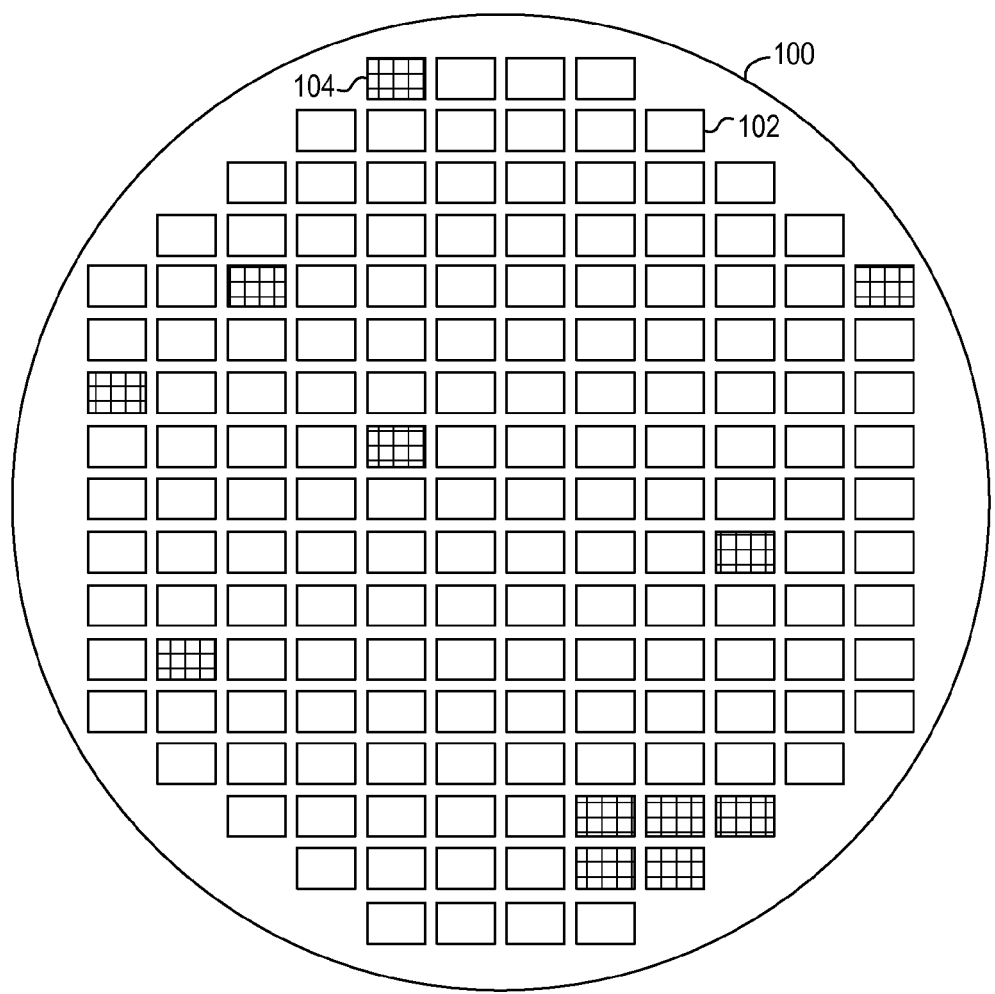
FIG. 1 shows a top view of a semiconductor wafer having multiple IC dice formed thereon.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

As feature dimensions become smaller, creating defect-free wafers and the IC dice built thereon becomes more challenging. Conventionally, an IC die must be defect-free in order to be used in constructing a package for a product. Both IC dice having major and minor defects would be discarded, wasting valuable manufacturing and material resources. Product development and manufacturing costs may increase due to a poor yield of IC dice, resulting in fewer resources for new products and lower profits. The methods disclosed herein may substantially reduce the number of IC dice that would have been discarded using prior approaches.

The methods reduce the number of IC dice that may be discarded due to defective circuit elements by matching IC dice having defective circuit elements to definitions of products that indicate circuitry required for the products. In addition, after the IC dice have been manufactured, new product definitions may be formulated without incurring IC development costs. Tools used to implement designs on the IC dice avoid use of any defective circuit elements. In one method, IC dice are manufactured from a common specification. That is, the IC dice are made with the same mask set with the objective to create functionally identical IC dice.

The IC dice are tested for defective circuit elements. For example, while the chips are on the wafer, probes of an electronic tester may be placed in contact with probe pads on the dice to test various capabilities and individual circuit elements of the dice. Based on the testing, respective sets of defect data are generated for the IC dice. Each defect set indicates defective circuitry in a corresponding one of the IC die. The defective circuitry may be indicated by designating areas of the dice that contain defective circuit elements or by locations of defective circuit elements on the dice.

The IC dice are assigned to bins based on the respective defect sets such that dice having equivalent defect sets are assigned to the same bin. In other words, in each of the bins, the respective defect sets of all IC dice assigned to the bin are equivalent.

Definitions of different products are used to select suitable dice from the bins for making the products. Each product definition indicates a respective set of circuitry required for a corresponding product. In manufacturing a package for a product, one or more IC dice are selected from one or more of the bins. The selected die or dice have sufficient circuit resources, as indicated by the respective defect set(s) relative to the product definition, to make a package of the product. A package of the product may then be manufactured using the selected die or dice.

FIG. 1 shows a top view of a semiconductor wafer 100 having multiple IC dice formed thereon. The dice, such as die 102, are shown as blocks on the wafer. The individual dice are made according to a common specification. The common specification defines identical circuitry in the plurality of IC dice. That is, the resulting dice are intended to be functionally equivalent. Those dice that are defect free would be functionally equivalent. However, the capabilities of dice having defective circuitry may vary. Dice that are found to be defect free are shown as unfilled blocks, and dice that are found to contain defective circuitry are shown as blocks filled with crosshatching. For example, die 102 is defect free, and die 104 contains defective circuitry.

The dice on wafer 100 may be used in making packages for different products based on the circuit defects found on the dice. For example, die 102 and other defect-free dice may be used in making packages for products in which all the functionality of the dice is available for use. Though die 104 contains defective circuitry, it may be partially functional and suitable for use in a product having less functionality than die 102. Also, different ones of the defective dice may be used to make packages for different products. Since the dice having defective circuitry may have different sets of circuit elements that are defective, products having different levels of functionality may be made based on the resources that are available on the partially defective dice.

Figure 2:
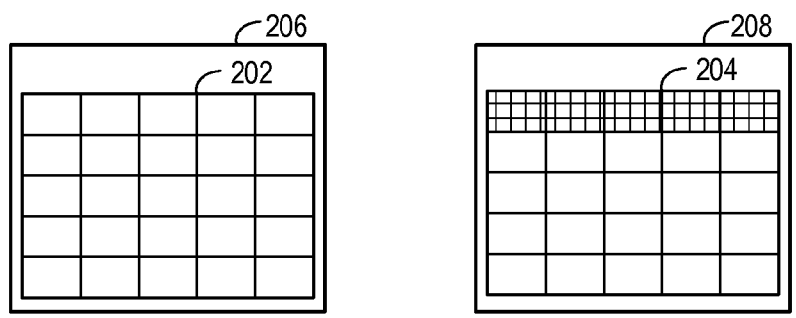
FIG. 2 shows two dice and single-die packages of products that may be made from the dice.

FIG. 2 shows two dice and single-die packages of products that may be made from the dice. Die 202 is defect free, and die 204 has defective circuitry. Note that for ease of illustration, each die is shown as a grid of blocks, with functional circuitry indicated by an unfilled block and defective circuitry indicated by a crosshatched block. In an example implementation, each block may represent an area of a die, and a crosshatched block indicates that one or more circuit elements within the area bounded by the block is defective, and other circuitry in that area of the die also being designated as unusable. The grid representation is also convenient for illustrating applications to programmable ICs having field programmable gate array (FPGA) logic since the programmable resources, such as logic blocks, BRAM, input/output blocks, gigabit transceivers, etc., are arranged in an array. The numbers and types of resources that may be rendered unusable in a die will vary according to the location of the defective circuit elements. For example, in FPGA logic, there may be fewer gigabit transceivers, input/output blocks, BRAM, and/or logic blocks, depending on the location of the defective circuitry and the chosen size of the area surrounding that location. It will be appreciated that the level of granularity by which portions of an IC die may be designated as defective may vary according to the type of IC die and need not be indicated as blocks in a grid. For example, the granularity by which defective portions may be designated as unusable may range from individual transistors to a processor block in a multi-core processor.

Block 206 represents a package made for a product requiring a defect-free die, and block 208 represents a package made for a product made from the partially defective die 204. The product made with die 204 may be referred to as a "derived" product since the die 204 is made from the same specification as die 202 but has fewer resources available than die 202.

In alternative implementations, the defect sets for dice may indicate defective circuitry on the dice by specifying features of the dice rather than areas on the dice. For example, each defect set may specify location information that specifies locations of particular defective tiles of a programmable IC or locations of defective transistors of a die.

Figure 3:
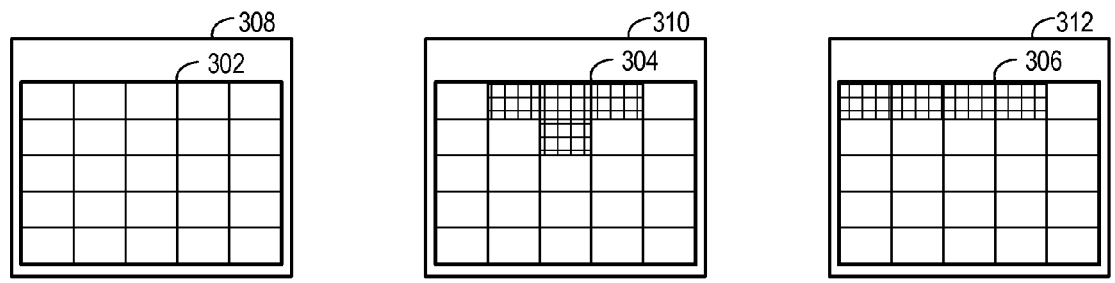
FIG. 3 shows three dice and single-die packages of products that may be made from the dice.
Figure 4:
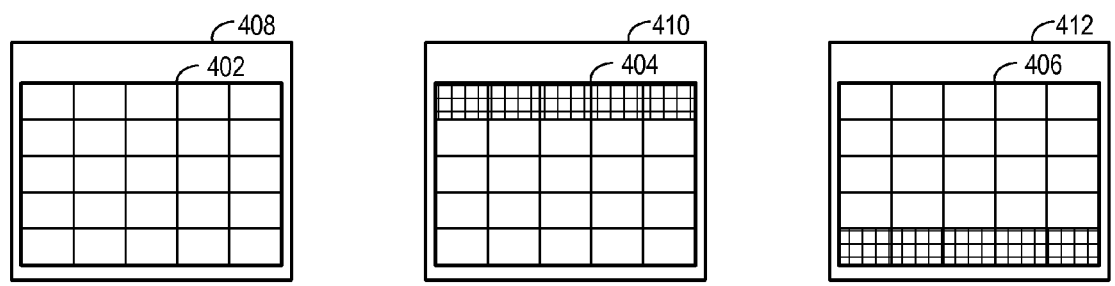
FIG. 4 shows three dice and single-die packages of products that may be made from the dice.
Figure 5:
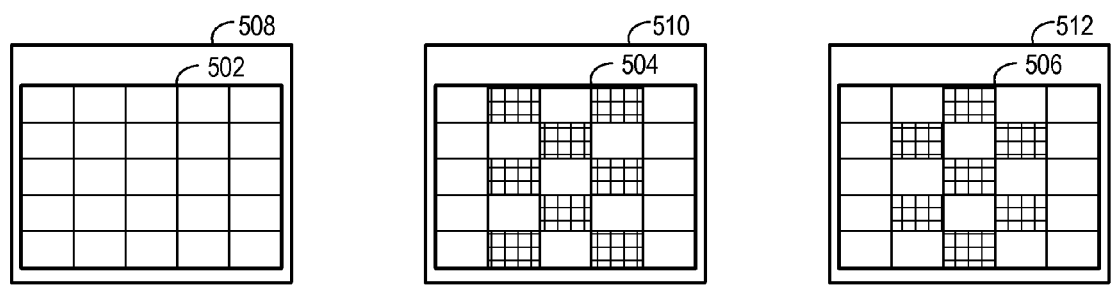
FIG. 5 shows three dice and single-die packages of products that may be made from the dice.

FIGS. 3, 4, and 5 show that dice having different defect patterns may be used to make packages for multiple products. Though each figure shows only three products and two different defect patterns, it will be recognized that additional different products may be derived depending on the particular circuitry found to be defective on other dice and potential benefits gained from making products having the resources provided by those other dice.

FIG. 3 shows three dice 302, 304, and 306 and single-die packages 308, 310, and 312 of products that may be made from the dice. A first product requires an IC die without defects, and an instance of the first product is shown as package 308. A second product can be made from an IC die having one set of defective circuit elements, and an instance of the second product is shown as package 310. A third product can be made from an IC die having another set of defective circuit elements and an instance of the third product is shown as package 312. The set of defective circuit elements on die 304 is different from the set of defective circuit elements on die 306, and the product provided as package 310 has a different set of enabled resources than the product provided as package 312.

FIG. 4 shows three dice 402, 404, and 406 and single-die packages 408, 410, and 412 of products that may be made from the dice. FIG. 5 shows three dice 502, 504, and 506 and single-die packages 508, 510, and 512 of products that may be made from the dice. The examples shown in FIGS. 4 and 5 illustrate that the sets of defective circuitry in the dice used for different products may not overlap, and areas of defective circuitry need not be contiguous if areas are used to define the defect sets. The place-and-route software that processes a circuit design is configured with information that indicate areas of the die to avoid.

Figure 6:
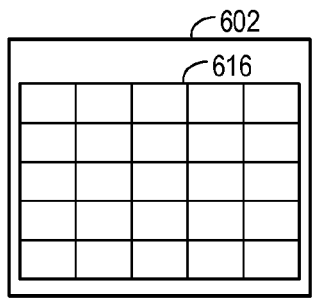
FIG. 6 shows an example in which single-die and stacked-die packages for products may be constructed using IC dice having different sets of defective circuit elements.
Figure 6:
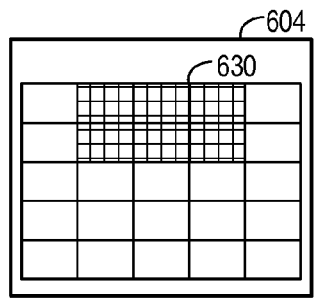
Figure 6:
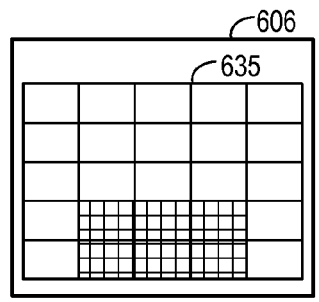
Figure 6:
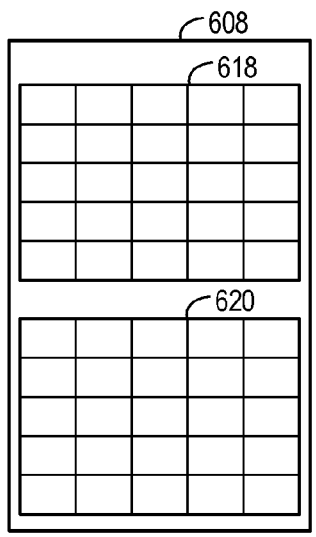
Figure 6:
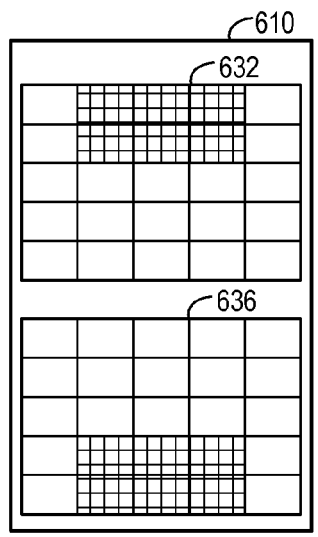
Figure 6:
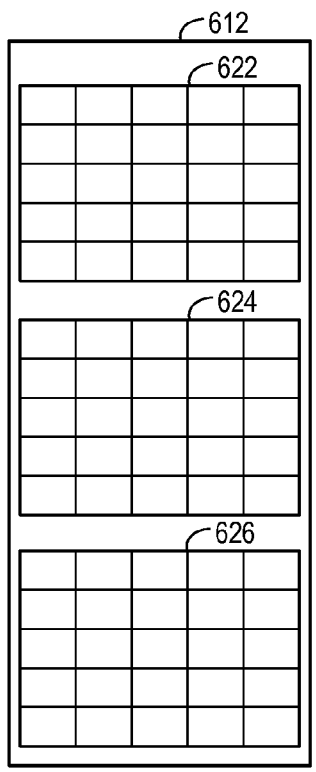
Figure 6:
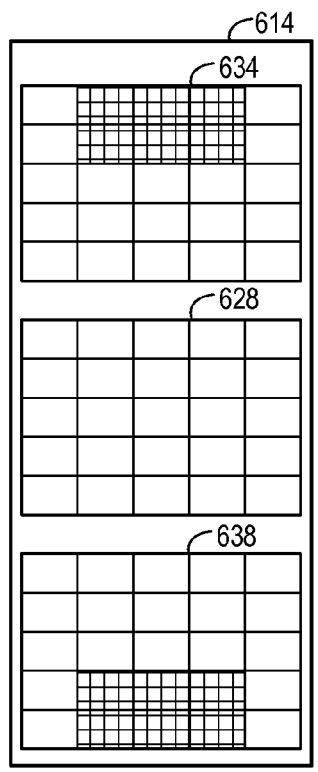

FIG. 6 shows an example in which single-die and stacked-die packages for products may be constructed using IC dice having different sets of defective circuit elements. Packages for seven different products are made using combinations of defect-free dice, a first set of dice having a first defect set, and a second set of dice having a second defect set. Packages 602, 604, and 606 are single-die packages; packages 608 and 610 are stacked-die packages having two dice; and packages 612 and 614 are stacked-die packages having three dice. The stacked-die packages may include an interposer (not shown) on which the dice are mounted. The interposer interconnects the dice and may provide contact pads or a ball grid array for connecting to external signals and power. Dice 616, 618, 620, 622, 624, 626, and 628 are defect-free dice; dice 630, 632, and 634 have equivalent defect sets; and dice 635, 636, and 638 have equivalent defect sets.

In one approach, a product may be defined to use either a partially defective die or a defect-free IC die with selected circuitry disabled. Disabling the selected circuitry on the defect-free die reduces the available functionality of the defect-free die to the available functionality of the partially defective die. This approach may be especially useful for multi-die packages in scenarios in which there are not enough partially defective dice to make complete packages. For example, package 610 has two partially defective dice 632 and 636, each having a different defect set. The dice 632 and 636 are made according to the same specification as defect-free dice 618 and 620. In making the dice, there may be more defect-free dice than there is demand for packages 608, and more demand for packages 610 than there are partially defective dice for use as die 632 (or 636). If there is a surplus defect-free dice, then a defect-free die may be used in package 610 in place of die 632. The same set of circuit elements that are indicated as being defective and unusable in die 632 may be disabled from being used in the defect-free die.

Figure 7:
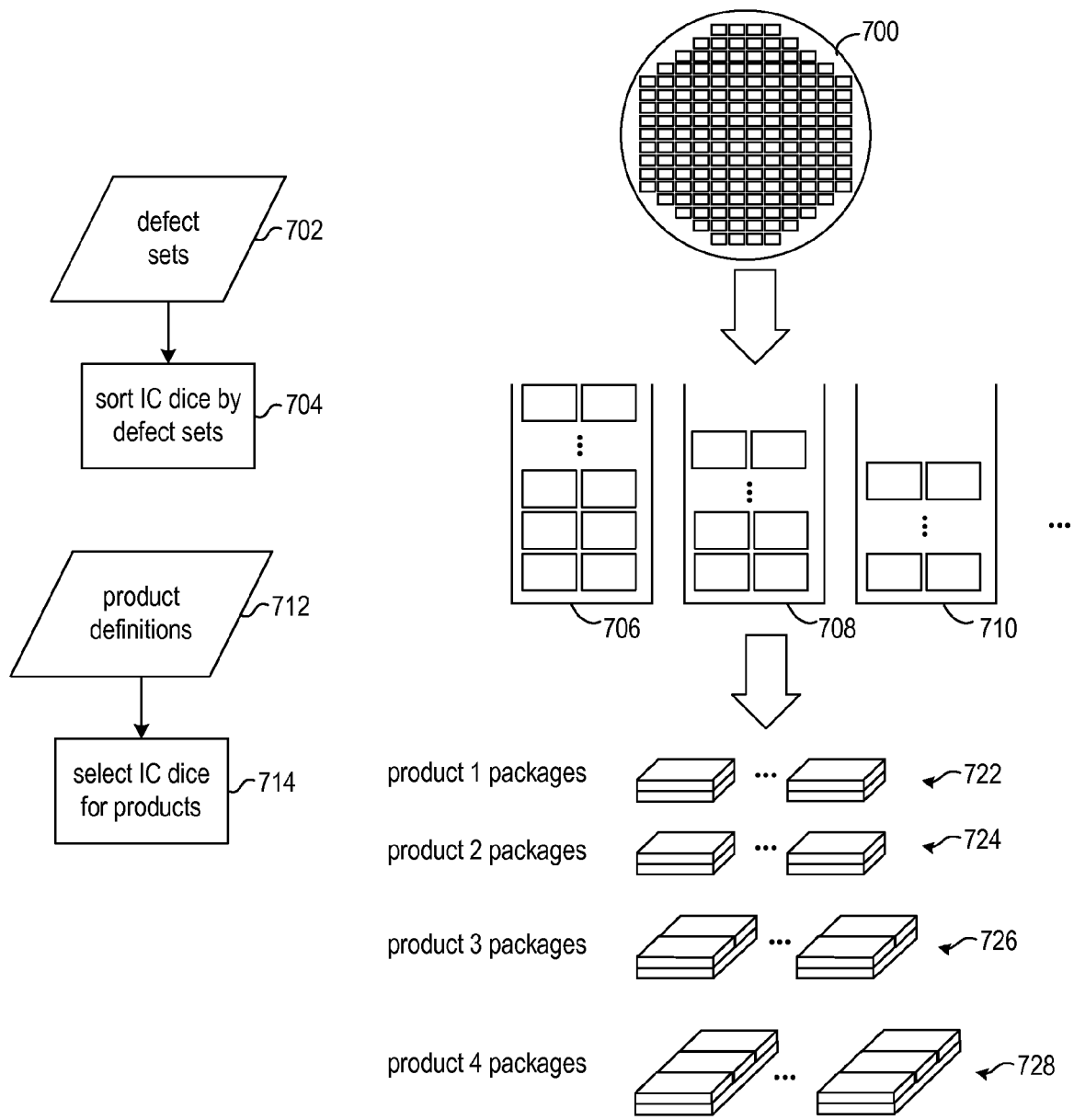
FIG. 7 shows a flow diagram in which IC dice are sorted according to defect sets, and IC dice are selected and product packages constructed based on product definitions and defect sets of the dice.

FIG. 7 shows a flow diagram in which IC dice are sorted according to defect sets, and IC dice are selected and product packages constructed based on product definitions and defect sets of the dice. The dice on wafer 700 are tested and defect sets 702 are generated from the testing. Each die has an associated defect set, and the defect set indicates the defective circuitry on the die.

As shown by block 704, the dice of the wafer 700 are sorted into bins based on the defect sets of the dice. Elements 706, 708 and 710 are examples of bins, and the blocks within each bin represent dice that have been assigned to the bins. Dice having the equivalent defect sets are sorted into the same bin. Defect-free dice may be assigned to one of the bins, for example, bin 706, and groups of partially defective dice may be assigned to the other bins, such as bins 708 and 710. Though only three bins are shown, it will be appreciated that any number of bins may be used for associating groups of dice having equivalent defect sets. In one approach, the bins are logical bins, and the bins to which the dice are assigned, along with the associated defect sets, are maintained by a computer system.

In each of the bins, the assigned dice have equivalent defect sets. For example, the dice assigned to bin 706 have equivalent defect sets, the dice assigned to bin 708 have equivalent defect sets, and the dice assigned to bin 710 have equivalent defect sets. If each defect set indicates defective circuitry in terms of area on a die, then two defect sets are equivalent if the area indicated on one die is the same as the area indicated on another die. If each defect set indicates defective circuitry in terms of tile locations on a die, then two defect sets are equivalent if the tile location(s) indicated on one die is the same as the tile location(s) indicated on another die. If each defect set indicates defective circuitry in terms of location information of defective transistors on a die, then two defect sets are equivalent if the location information indicates equivalent sets of transistors on two dice.

After sorting the dice into bins, product definitions 712 and defect sets of the dice in the bins are used to select dice to make packages for different products, as shown by block 714. Examples of packages for four products are illustrated. For product 1, the set 722 of packages is manufactured, for product 2, the set 724 of packages is manufactured, for product 3, the set 726 of packages is manufactured, and for product 4, the set 728 of packages is manufactured. Each of the packages for products 1 and 2 has a single die, each of the packages for product 3 has two dice, and each of the packages for product 4 has four dice. It will be appreciated that there may be multiple 2-die products and multiple 3-die products depending on product demand and business objectives.

In selecting the dice for the different products, the dice may be selected from different subsets of the bins according to product definitions and the defect sets. For example, the dice for the product 1 packages may be selected from bin 708, and the dice for the product 2 packages may be selected from bins 706 and 708.

Figure 8:
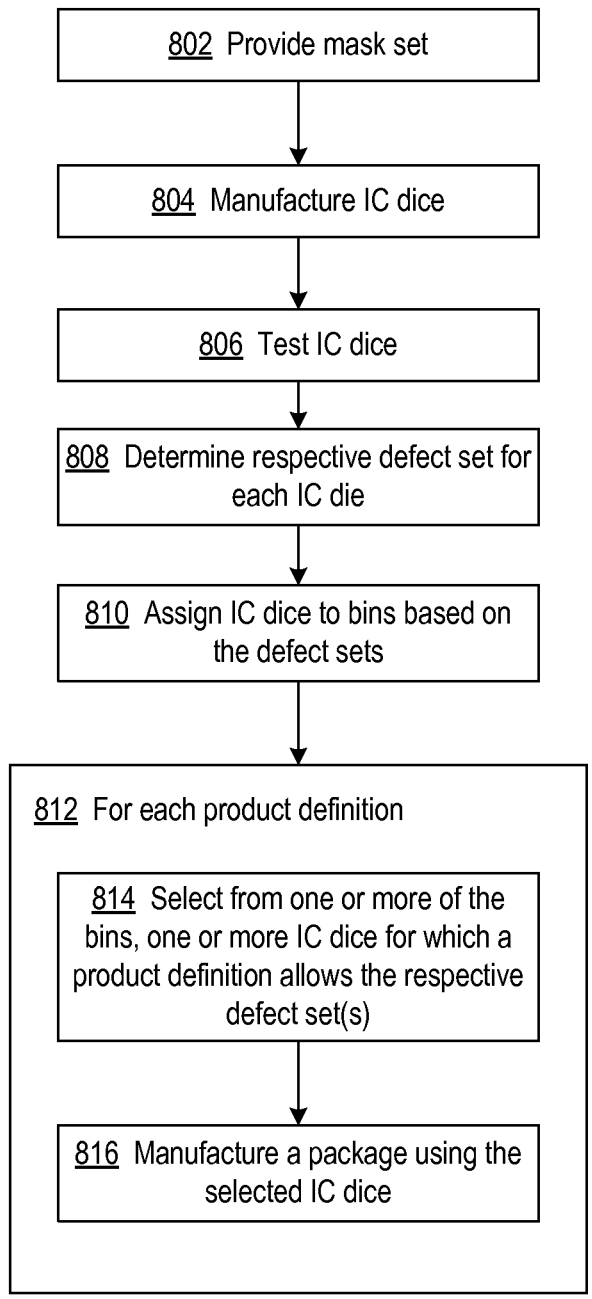
FIG. 8 is a flowchart of a process for making different products from IC dice.

FIG. 8 is a flowchart of a process for making different products from IC dice. At block 802, a mask set for an IC circuit design is provided and at block 804, IC dice are manufactured using the mask set. The dice are tested at block 806, and respective defect sets are determined and generated for the dice at block 808. At block 810, the dice are assigned to bins according to the respective defect sets of the dice. The dice assigned to each bin have the same or equivalent defect sets.

The operations in block 812 are performed for each product definition for which packages of a product are to be made. The product definitions may be prepared by a the programmable IC provided and provided for processing based on anticipated or actual customer demand. Some of the product definitions may be created after the dice have been sorted into bins and based on customer demand for product features. Each product definition indicates a respective set of circuitry required for a corresponding product. For example, a product definition may indicate required area(s) of a die, required numbers of different circuit resources or any other definition that can be compared with the defect sets of the binned dice.

At block 814, one or more dice are selected from one or more of the bins to create a package of a product. For a single-die package, only one die is selected, and for a multi-die package, multiple dice are selected.

In one implementation, the selecting of dice for a multi-die package may use a product definition that specifies slot options for the positions of dice in the package. The slot options indicate for one or more of the die positions of the package, alternative defect sets that are permissible for the die position. In selecting a die for a die position of a package for which slot options are defined, a die may be selected from either a first bin or a second bin, where dice in the first bin have respective defect sets that are equivalent to one of the alternative defect sets of the slot options, and dice assigned to the second bin have respective defect sets that are equivalent to another one of the alternative defect sets of the slot options.

At block 816, a package is manufactured from the selected die or dice. Note that the terms "packaging", "packaged IC", and other related terms refer to the process of assembling a die structure that includes an IC die and typically provides a physical interface between a system and the IC die, and/or the structure resulting from such a process. The IC die/dice may be packaged in flip-chip packages, for example. However, the disclosed methods are not limited to processes and assemblies involving flip-chip packages, nor to other types of IC packages currently known, but can be applied to other die assemblies, including die assemblies that have not yet been developed.

Figure 9:
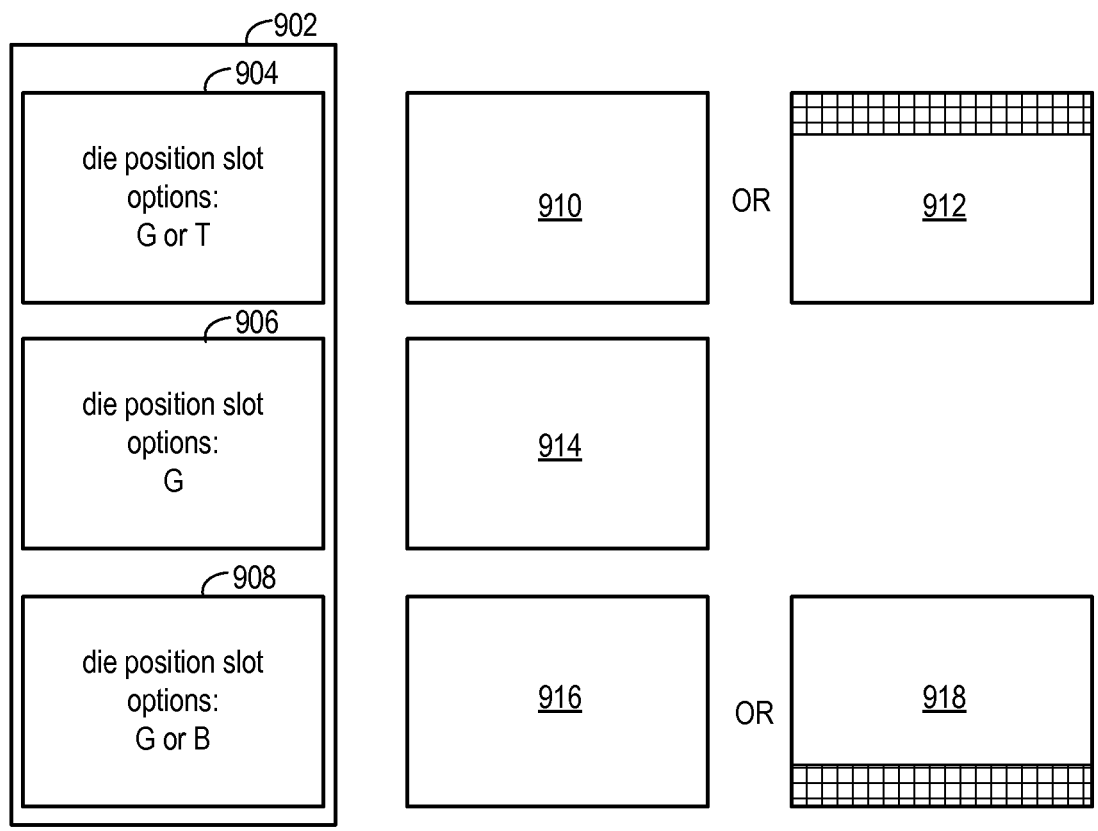
FIG. 9 shows a product definition having slot options for a product.

FIG. 9 shows a product definition having slot options for a product. Block 902 represents the product definition, and blocks 904, 906, and 908 represent the slot options for die positions of a multi-die package. Block 904 specifies the slot options for die position 1 of the package, block 906 specifies the slot options for die position 2 of the package, and block 908 specifies the slot options for die position 3 of the package.

The slot options for die position 1 are "G or T." "G" indicates a defect-free die, and "T" indicates that a die having defects in a top area of the die is permitted. For example, die 910 is a defect free die, and die 912 has defects in the top area as indicated by the crosshatching. The slot options for die position 2 include only "G." Thus, only a defect-free die 914 may be used for position 2. The slot options for die position 3 are "G or B." "G" indicates a defect-free die, and "B" indicates that a die having defects in a bottom area of the die is permitted. For example, die 916 is a defect free die, and die 918 has defects in the bottom area as indicated by the crosshatching. If a defect-free die is used in a die position having a slot option indicating a partially defective die, the area in the defect-free die corresponding to the defective area in the partially defective die is disabled to make the defect-free die functionally equivalent to the partially defective die.

Figure 10:
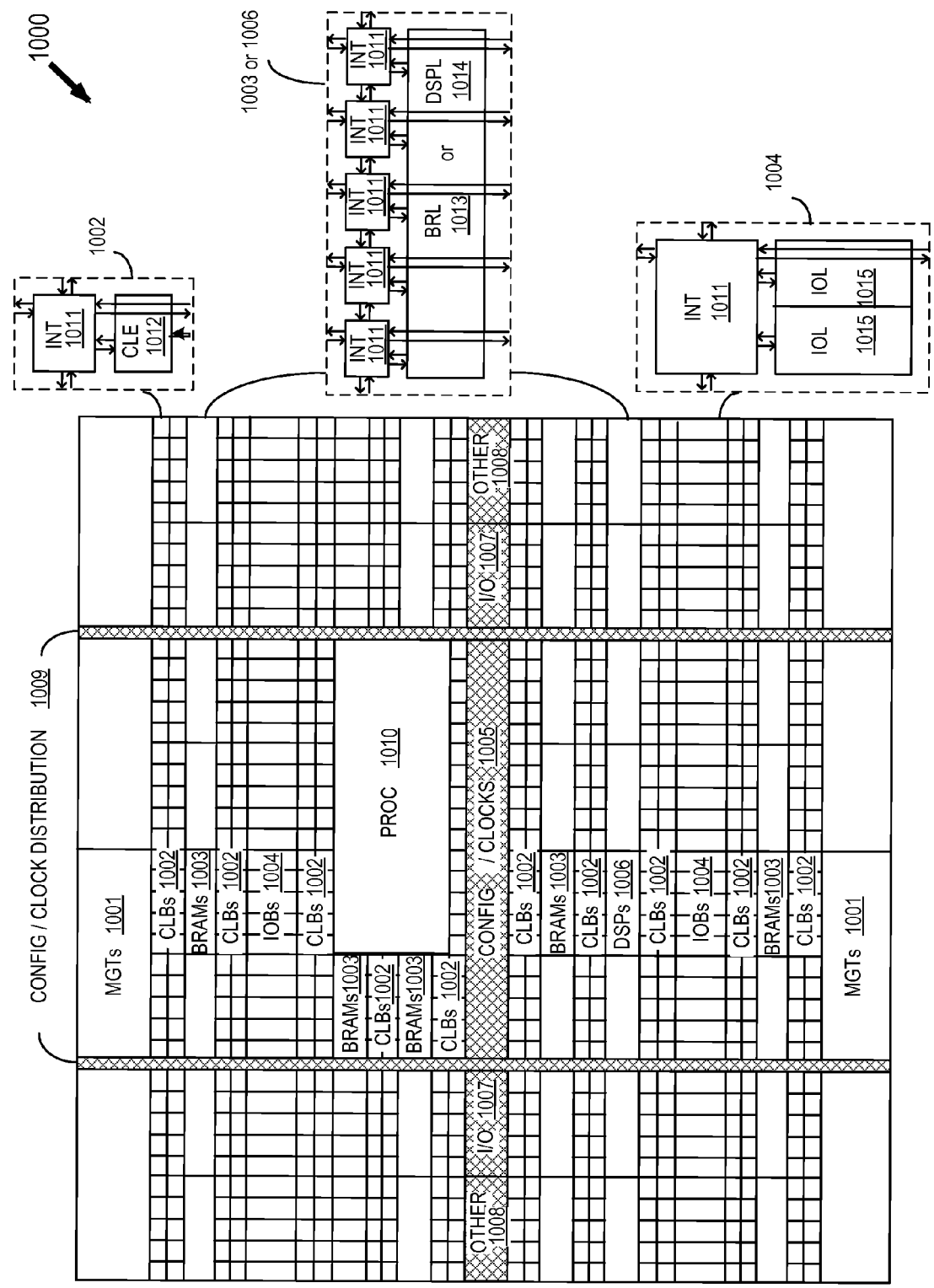
FIG. 10 shows circuit elements of an IC die that implement a programmable IC.

FIG. 10 shows circuit elements of an IC die that implement a programmable IC. The IC die may be packaged with additional, similar IC die to make products having additional or different sets of programmable resources, depending on product requirements and circuit elements found to be defective prior to packaging.

The programmable IC may also be referred to as a System On Chip (SOC) that includes field programmable gate array logic (FPGA) along with other programmable resources. FPGA logic may include several different types of programmable logic blocks in the array. For example, FIG. 10 illustrates programmable IC 1000 that includes a large number of different programmable tiles including multi-gigabit transceivers (MGTs) 1001, configurable logic blocks (CLBs) 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007, for example, clock ports, and other programmable logic 1008 such as digital clock managers, analog-to-digital converters, system monitoring logic, and so forth. Some programmable IC having FPGA logic also include dedicated processor blocks (PROC) 1010 and internal and external reconfiguration ports (not shown).

In some FPGA logic, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA logic. The programmable interconnect element INT 1011 also includes the connections to and from the programmable logic element within the same tile, as shown by the examples included at the top of FIG. 10.

For example, a CLB 1002 can include a configurable logic element CLE 1012 that can be programmed to implement user logic, plus a single programmable interconnect element INT 1011. A BRAM 1003 can include a BRAM logic element (BRL) 1013 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 1006 can include a DSP logic element (DSPL) 1014 in addition to an appropriate number of programmable interconnect elements. An IOB 1004 can include, for example, two instances of an input/output logic element (IOL) 1015 in addition to one instance of the programmable interconnect element INT 1011. As will be clear to those of skill in the art, the actual I/O bond pads connected, for example, to the I/O logic element 1015, are manufactured using metal layered above the various illustrated logic blocks, and typically are not confined to the area of the input/output logic element 1015.

In the pictured embodiment, a columnar area near the center of the die (shown shaded in FIG. 10) is used for configuration, clock, and other control logic. Horizontal areas 1009 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 10 include additional logic blocks that disrupt the regular columnar structure making up a large part of the programmable IC. The additional logic blocks can be programmable blocks and/or dedicated logic. For example, the processor block PROC 1010 shown in FIG. 10 spans several columns of CLBs and BRAMs.

Note that FIG. 10 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods are thought to be applicable to a variety of systems for manufacturing IC packages. Other aspects and features will be apparent to those skilled in the art from consideration of the specification. It is intended that the specification and drawings be considered as examples only, with a true scope of the invention being indicated by the following claims.

What is claimed is:

1. A method, comprising:
    manufacturing a plurality of integrated circuit (IC) dice from a common specification;
    testing for defective circuitry on the plurality of IC dice, and generating, for each IC die, a respective defect set that indicates defective circuitry in the IC die;
    assigning each die of the plurality of IC dice to one bin of a plurality of bins based on the respective defect sets, wherein, for each bin of the plurality of bins, all IC dice assigned to the bin have equivalent respective defect sets;
    providing a plurality of product definitions, each product definition indicating a respective set of circuitry required for a corresponding product of a plurality of products; and
    manufacturing respective sets of packages for each product of the plurality of products, the manufacturing of each package of a respective set of packages for each product including:
        selecting one or more IC dice from a subset of the plurality of bins, wherein the one or more IC dice have respective defect sets allowed by the product definition of the product; and
        manufacturing the one or more IC dice into the package.

2. The method of claim 1, wherein the manufacturing of each package of a respective set of packages for each product includes:
    selecting one or more IC dice from a first subset of the plurality of bins for each package of the respective set of packages for a first product of the plurality of products;
    selecting one or more IC dice from a second subset of the plurality of bins for each package of the respective set of packages for a second product of the plurality of products; and
    the first subset of the plurality of bins is different from the second subset of the plurality of bins.

3. The method of claim 1, wherein the manufacturing of each package of a respective set of packages for each product includes:
    selecting one IC die from one of the plurality of bins for each package of the respective set of packages for a first product of the plurality of products;
    manufacturing the one IC die into the package of the respective set of packages for the first product;
    selecting a plurality of IC dice from a subset of the plurality of bins for each package of the respective set of packages for a second product of the plurality of products; and
    manufacturing the plurality of IC dice into the package of the respective set of packages for the second product.

4. The method of claim 1, wherein the common specification defines identical circuitry in the plurality of IC dice.

5. The method of claim 1, wherein each respective defect set specifies one or more areas of a IC die of the plurality of IC dice.

6. The method of claim 1, wherein each respective defect set specifies location information for one or more defective transistors of a IC die of the plurality of IC dice.

7. The method of claim 1, wherein:
    each IC die of the plurality of IC dice is a programmable IC having programmable resources arranged in tiles; and
    each respective defect set specifies location information for one or more tiles of an IC die of the plurality of IC dice.

8. The method of claim 1, wherein:
    each respective defect set specifies one or more areas of an IC die of the plurality of IC dice; and
    all IC dice assigned to a bin of the plurality of bins have respective defect sets that specify equivalent areas.

9. The method of claim 1, wherein:
    each IC die of the plurality of IC dice is a programmable IC having programmable resources arranged in tiles;
    each respective defect set specifies location information for one or more tiles of an IC die of the plurality of IC dice; and
    all IC dice assigned to a bin of the plurality of bins have respective defect sets that specify equivalent tile locations.

10. The method of claim 1, wherein:
    each respective defect set specifies location information for one or more defective transistors of a IC die of the plurality of IC dice; and
    all IC dice assigned to a bin of the plurality of bins have respective defect sets that specify equivalent sets of transistors.

11. A method, comprising:
    manufacturing a plurality of integrated circuit (IC) dice from a common specification;
    testing for defective circuitry on the plurality of IC dice, and generating, for each IC die, a respective defect set that indicates defective circuitry in the IC die;
    assigning each die of the plurality of IC dice to one bin of a plurality of bins based on the respective defect sets, wherein, for each bin of the plurality of bins, all IC dice assigned to the bin have equivalent respective defect sets;
    providing a plurality of product definitions, each product definition indicating a respective set of circuitry required for a corresponding product of a plurality of products;
    wherein one of the product definitions specifies slot options for one of the plurality of products, the slot options indicating, for each IC-die position of a plurality of IC-die positions on a package of the one product, alternative defect sets that are permissible for each of the IC-die positions; and
    manufacturing respective sets of packages for each product of the plurality of products, the manufacturing of each package of a respective set of packages for each product including:
        selecting one or more IC dice from a subset of the plurality of bins, wherein the one or more IC dice have respective defect sets allowed by the product definition of the product;

wherein the selecting includes selecting, for each IC-die position on the package of the one product, an IC die from one of a first bin or a second bin of the plurality of bins, IC dice in the first bin having respective defect sets equivalent to one of the alternative defect sets, and IC dice in the second bin having respective defect sets equivalent to another one of the alternative defect sets; and manufacturing the one or more IC dice into the package.

12. The method of claim 11, wherein the manufacturing of each package of a respective set of packages for each product includes:

selecting one or more IC dice from a first subset of the plurality of bins for each package of the respective set of packages for a first product of the plurality of products;

selecting one or more IC dice from a second subset of the plurality of bins for each package of the respective set of packages for a second product of the plurality of products; and the first subset of the plurality of bins is different from the second subset of the plurality of bins.

13. The method of claim 11, wherein the manufacturing of each package of a respective set of packages for each product includes:

selecting one IC die from one of the plurality of bins for each package of the respective set of packages for a first product of the plurality of products;

manufacturing the one IC die into the package of the respective set of packages for the first product;

selecting a plurality of IC dice from a subset of the plurality of bins for each package of the respective set of packages for a second product of the plurality of products; and manufacturing the plurality of IC dice into the package of the respective set of packages for the second product.

14. The method of claim 11, wherein the common specification defines identical circuitry in the plurality of IC dice.

15. The method of claim 11, wherein each respective defect set specifies one or more areas of a IC die of the plurality of IC dice.

16. The method of claim 11, wherein each respective defect set specifies location information for one or more defective transistors of a IC die of the plurality of IC dice.

17. The method of claim 11, wherein:

each IC die of the plurality of IC dice is a programmable IC having programmable resources arranged in tiles; and each respective defect set specifies location information for one or more tiles of an IC die of the plurality of IC dice.

18. The method of claim 11, wherein:

each respective defect set specifies one or more areas of an IC die of the plurality of IC dice; and all IC dice assigned to a bin of the plurality of bins have respective defect sets that specify equivalent areas.

19. The method of claim 11, wherein:

each IC die of the plurality of IC dice is a programmable IC having programmable resources arranged in tiles;

each respective defect set specifies location information for one or more tiles of an IC die of the plurality of IC dice; and all IC dice assigned to a bin of the plurality of bins have respective defect sets that specify equivalent tile locations.

20. The method of claim 11, wherein:

each respective defect set specifies location information for one or more defective transistors of a IC die of the plurality of IC dice; and all IC dice assigned to a bin of the plurality of bins have respective defect sets that specify equivalent sets of transistors.

* * * * *